(12) United States Patent
Chiu (10) Patent No.: US 11,749,565 B2
(45) Date of Patent: Sep. 5, 2023

(54) SEMICONDUCTOR DEVICE AND MANUFACTURING METHOD THEREOF

(71) Applicant: NANYA TECHNOLOGY CORPORATION, New Taipei (TW)

(72) Inventor: Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 233 days.

(21) Appl. No.: 17/446,460

(22) Filed: Aug. 30, 2021

(65) Prior Publication Data

US 2023/0066256 A1    Mar. 2, 2023

(51) Int. Cl.
| | | |
|---|---|---|
| H01L 21/768 | (2006.01) | |
| H01L 23/00 | (2006.01) | |
| H01L 25/00 | (2006.01) | |
| H01L 25/065 | (2023.01) | |
| H01L 23/48 | (2006.01) | |

(52) U.S. Cl.
CPC .. *H01L 21/76898* (2013.01); *H01L 21/76808* (2013.01); *H01L 21/76831* (2013.01); *H01L 23/481* (2013.01); *H01L 24/05* (2013.01); *H01L 24/08* (2013.01); *H01L 24/80* (2013.01); *H01L 25/0657* (2013.01); *H01L 25/50* (2013.01); *H01L 2224/0569* (2013.01); *H01L 2224/08146* (2013.01); *H01L 2224/80001* (2013.01); *H01L 2225/06541* (2013.01)

(58) Field of Classification Search
CPC combination set(s) only.
See application file for complete search history.

(56) References Cited

U.S. PATENT DOCUMENTS

| | | | |
|---|---|---|---|
| 7,354,798 B2 * | 4/2008 | Pogge | H01L 25/50 257/E21.705 |
| 9,991,308 B2 * | 6/2018 | Lee | H01L 27/14612 |
| 10,510,946 B2 * | 12/2019 | Bhushan | H10N 50/80 |
| 2003/0193076 A1 * | 10/2003 | Patti | H01L 25/50 257/E21.597 |
| 2015/0021789 A1 | 1/2015 | Lin | |
| 2016/0013160 A1 * | 1/2016 | Chun | H01L 25/50 257/751 |
| 2017/0358553 A1 * | 12/2017 | Kim | H01L 24/29 |
| 2019/0244899 A1 | 8/2019 | Enquist et al. | |
| 2020/0294958 A1 * | 9/2020 | Shibata | H01L 24/08 |

\* cited by examiner

*Primary Examiner* — Niki H Nguyen
(74) *Attorney, Agent, or Firm* — CKC & Partners Co., LLC (57) ABSTRACT

A method of manufacturing a semiconductor device includes forming a first recess in a first wafer. The first recess is at a first front-side surface of the first wafer and exposes a first interconnect structure in the first wafer. A second recess is formed in a second wafer. The second recess is at a second front-side surface of the second wafer. The first recess is filled with a first polymer. The second recess is filled with a second polymer. The first front-side surface of the first wafer is bonded with the second front-side surface of the second wafer such that the first polymer is bonded to the second polymer. The first polymer in the first recess and the second polymer in the second recess are removed. A metal is deposited in the first recess and the second recess.

19 Claims, 9 Drawing Sheets

SEMICONDUCTOR DEVICE AND MANUFACTURING METHOD THEREOF

BACKGROUND

Field of Disclosure

The present disclosure relates to a semiconductor device and a manufacturing method thereof. More particularly, the present disclosure relates to hybrid bonding of the semiconductor device.

Description of Related Art

A 3D integrated circuit is a structure formed by stacking wafers vertically. The stacking wafers are connected by, such as, through silicon vias (TSVs) or copper-copper bonding. The resulting structure can achieve several advantages. For example, the 3D integrated circuit has a smaller footprint to increase the integration density, and shorter wiring in the 3D integrated circuit can reduce the power consumption of the 3D integrated circuit. However, the technology of 3D integrated circuits still faces with several challenges that should be solved.

SUMMARY

In accordance with some embodiments of the present disclosure, a method of manufacturing a semiconductor device includes forming a first recess in a first wafer. The first recess is at a first front-side surface of the first wafer and exposes a first interconnect structure in the first wafer. A second recess is formed in a second wafer. The second recess is at a second front-side surface of the second wafer. The first recess is filled with a first polymer. The second recess is filled with a second polymer. The first front-side surface of the first wafer is bonded with the second front-side surface of the second wafer such that the first polymer is bonded to the second polymer. The first polymer in the first recess and the second polymer in the second recess are removed. A metal is deposited in the first recess and the second recess.

In accordance with some embodiments of the present disclosure, the first recess is different in size from the second recess.

In accordance with some embodiments of the present disclosure, filling the first recess with the first polymer includes coating a polymer material over the first front-side surface of the first wafer. The first wafer is planarized at the first front-side surface to remove an excess portion of the polymer material to form the first polymer in the first recess.

In accordance with some embodiments of the present disclosure, a first dielectric layer of the first wafer is bonded to a second dielectric layer of the second wafer during bonding the first front-side surface of the first wafer with the second front-side surface of the second wafer such that the first polymer is bonded to the second polymer.

In accordance with some embodiments of the present disclosure, depositing the metal in the first recess and the second recess is such that the metal deposited in the first recess and the second recess is integrally formed.

In accordance with some embodiments of the present disclosure, the method further includes conformally depositing an insulating layer in the second recess before filling the second recess with the second polymer.

In accordance with some embodiments of the present disclosure, forming the second recess in the second wafer includes forming a pad recess of the second recesses at the second front-side surface of the second wafer. A through substrate via hole of the second recess is formed in the pad recess and extending to a substrate of the second wafer.

In accordance with some embodiments of the present disclosure, the method further includes grinding the second wafer from a backside surface of the second wafer to expose the second polymer in the through substrate via hole of the second recess after bonding the first front-side surface of the first wafer with the second front-side surface of the second wafer. A third dielectric layer is formed over the backside surface of the second wafer before removing the first polymer in the first recess and the second polymer in the second recess.

In accordance with some embodiments of the present disclosure, the method further includes forming a bump over the through substrate via hole after depositing the metal in the first recess and the second recess.

In accordance with some embodiments of the present disclosure, the method further includes depositing a barrier layer in the first and second recesses after removing the first polymer in the first recess and the second polymer in the second recess.

In accordance with some embodiments of the present disclosure, the first polymer in the first recess is removed by using a chemical solvent.

In accordance with some embodiments of the present disclosure, the metal comprises copper.

In accordance with some embodiments of the present disclosure, a width of the first recess is in a range from 0.2 μm to 20 μm.

In accordance with some embodiments of the present disclosure, a semiconductor device include a first wafer including a first interconnect structure, a second wafer including a second interconnect structure bonded to the first interconnect structure of the first wafer, a through substrate via extending through the second wafer, a conductive pad in contact with the through substrate via and the first interconnect structure of the first wafer, in which a portion of the conductive pad is embedded in the second wafer, and a barrier layer extending from a sidewall of the through substrate via to a bottom surface of the conductive pad.

In accordance with some embodiments of the present disclosure, the barrier layer is a single piece of continuous material.

In accordance with some embodiments of the present disclosure, the barrier layer is in contact with a front-side surface of the first wafer.

In accordance with some embodiments of the present disclosure, the conductive pad and the through substrate via are a single piece of continuous material.

In accordance with some embodiments of the present disclosure, the semiconductor device further includes a dielectric layer covering the second wafer, such that the second wafer is directly between the first wafer and the dielectric layer.

In accordance with some embodiments of the present disclosure, the barrier layer is in contact with the dielectric layer and the first interconnect structure of the first wafer.

The present disclosure improves the hybrid bonding process of a semiconductor device. More specifically, a polymer material is used to form a pad in recesses in different sizes. A wafer with the pad made of the polymer material in different sizes is well planarized, and the dishing issue during the planarization process can be reduced. Therefore, the subsequently formed conductive pads are able to be formed in different sizes.

BRIEF DESCRIPTION OF THE DRAWINGS

The disclosure can be more fully understood by reading the following detailed description of the embodiment, with reference made to the accompanying drawings as follows:

FIGS. 1A-9 illustrate cross-sectional views of intermediate stages in the manufacturing process of a semiconductor device in accordance with some embodiments of the present disclosure.

DETAILED DESCRIPTION

Reference will now be made in detail to the present embodiments of the disclosure, examples of which are illustrated in the accompanying drawings. Wherever possible, the same reference numbers are used in the drawings and the description to refer to the same or like parts.

The embodiments of the present disclosure are related to methods for manufacturing a semiconductor device by bonding polymer pads of two wafers together to improve hybrid bonding processes of the semiconductor device. The polymer pads are replaced with conductive pads after the hybrid bonding processes. Therefore, the subsequently formed conductive pads are able to be formed in different sizes.

Figure 1A:
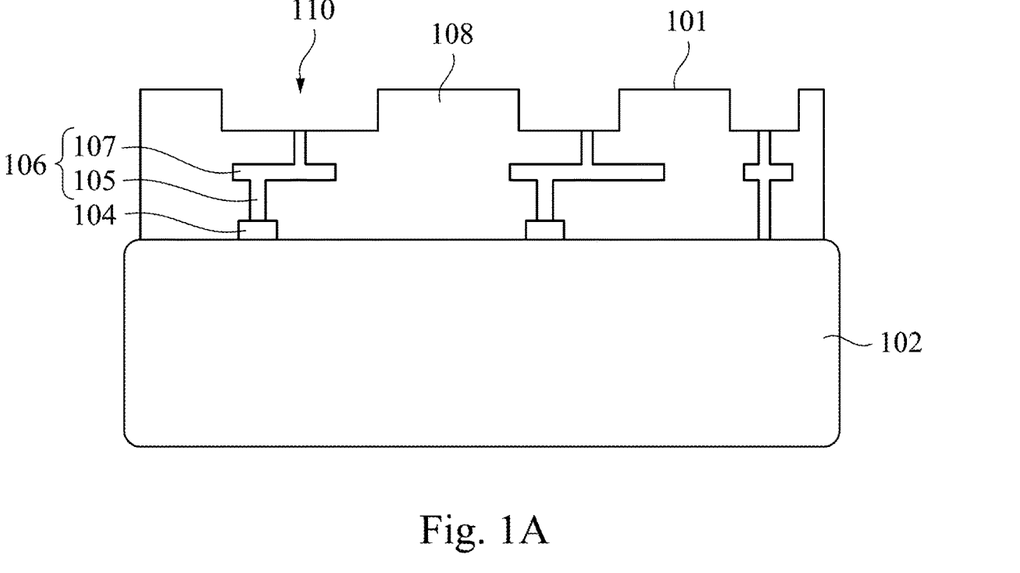

FIGS. 1A-9 illustrate cross-sectional views of intermediate stages in the manufacturing process of a semiconductor device in accordance with some embodiments of the present disclosure. Referring to FIG. 1A, a first wafer 100 is provided. The first wafer 100 may include a first substrate 102, first device elements 104, first interconnect structures 106 and a first dielectric layer 108. The first substrate 102 may include any suitable materials, such as semiconductor materials (e.g. silicon). The first device elements 104 are disposed over the first substrate 102 and may be any suitable components, such as active regions of the semiconductor device, or the like. For example, the first device elements 104 may be active components such as transistors and diodes. The first device elements 104 may also be passive components, such as resistors, inductors and capacitors, arranged over the substrate 102. The first interconnect structures 106 are used to provide electrical interconnection between the first device elements 104 and are made of conductive materials. In some embodiments, the first interconnect structures 106 include conductive vias 105 and conductive lines 107. The conductive vias 105 connect the conductive lines 107 in different level to form the first interconnect structures 106. The first dielectric layer 108 covers the first substrate 102, the first device elements 104 and the first interconnect structures 106 to electrically isolate the adjacent first interconnect structures 106. The first dielectric layer 108 may be made of any suitable material. In some embodiments, the first dielectric layer 108 is made of $SiO_2$, SiC, low-k materials, or the like.

A plurality of first recesses 110 are formed at a first front-side surface 101 of the first wafer 100 to expose the first interconnect structures 106. The first front-side surface 101 is also the surface of the first dielectric layer 108. The first recesses 110 are formed by a patterning process to form the first recesses 110 in different sizes. Stated another way, the sizes of the first recesses 110 are not be strictly controlled. In some embodiments, the width of each of the first recesses 110 is in a range from 0.2 µm to 20 µm.

Figure 1B:
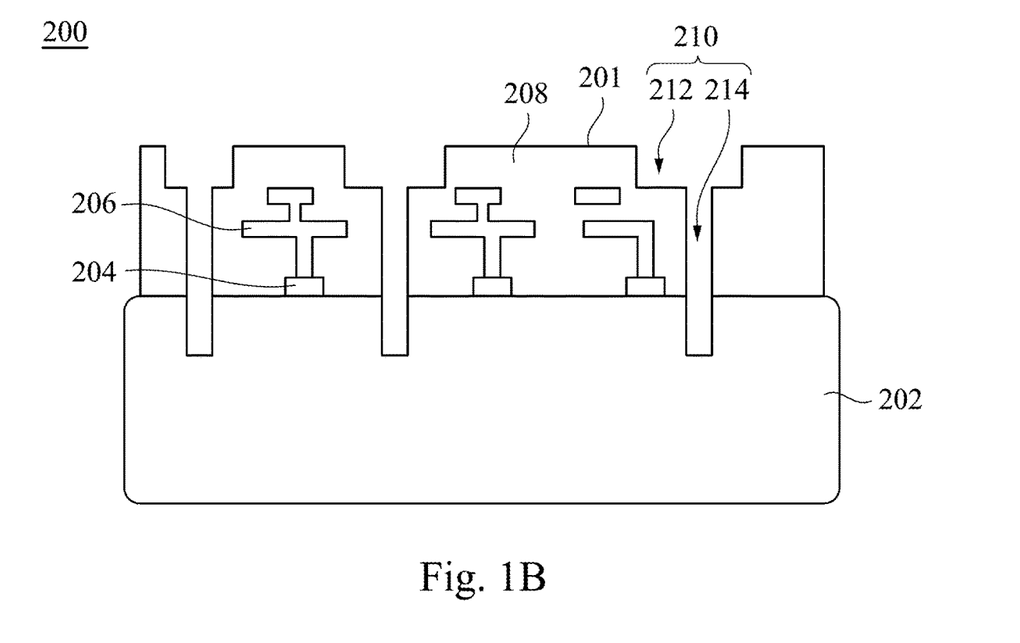

Referring to FIG. 1B, a second wafer 200 is provided. The second wafer 200 may include a second substrate 202, second device elements 204, second interconnect structures 206 and a second dielectric layer 208. The second substrate 202, the second device elements 204, the second interconnect structures 206 and the second dielectric layer 208 are similar to or the same as the first substrate 102, the first device elements 104, the first interconnect structures 106 and the first dielectric layer 108, respectively; therefore, detailed descriptions are not discussed herein.

A plurality of second recesses 210 are formed at a second front-side surface 201 of the second wafer 200. Forming the second recesses 210 includes first forming pad recesses 212 at a second front-side surface 201 of the second wafer 200. Through substrate via holes 214 of the second recesses 210 in the pad recesses 212 are then formed, and the through substrate via holes 214 extend to the second substrate 202 of the second wafer 200. The pad recesses 212 and the first recesses 110 will be used for depositing conductive pads (such as conductive pads 304 in FIG. 8), and the through substrate via holes 214 will be used for depositing vias (such as TSVs 306 in FIG. 8). The second front-side surface 201 is a surface of the second dielectric layer 208. The through substrate via holes 214 do not expose the second interconnect structures 206, so the material formed in through substrate via holes 214 in the subsequent process will not be in contact with the second interconnect structures 206, ensuring that the subsequently formed TSVs (such as TSVs 306 in FIG. 8) are electrically isolated with each other. In some embodiments, similar to the first recesses 110, the sizes of the pad recesses 212 of the second recesses 210 are not strictly controlled. Hence, the pad recesses 212 of the second recesses 210 are formed in different sizes. The first recess 110 may also be different in size from the pad recess 212 of the second recess 210. The pad recesses 212 of the second recesses 210 may be formed in any suitable sizes. In some embodiments, the width of each of the pad recesses 212 of the second recesses 210 is in a range from 0.2 µm to 20 µm.

Figure 2:
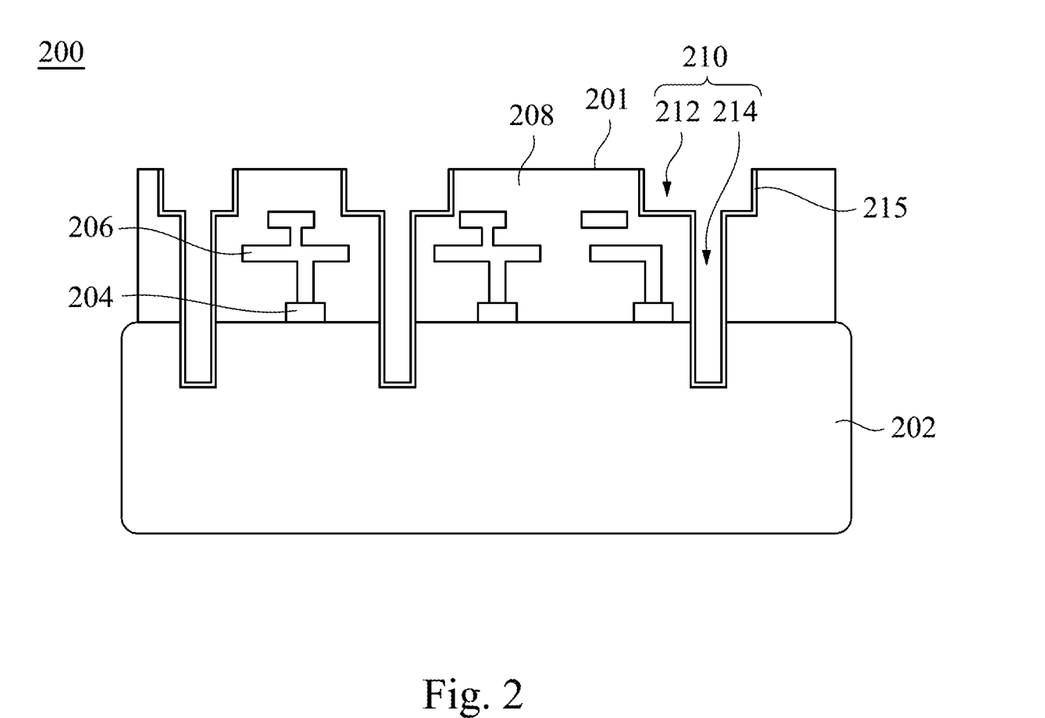

Referring to FIG. 2, in some embodiments, an insulating layer 215 is conformally deposited in the second recesses 210. The insulating layer 215 is for the isolation between the subsequently formed metal in the second recesses 210. In some other embodiments, the insulating layer 215 may not be formed in the second recesses 210.

Figure 3A:
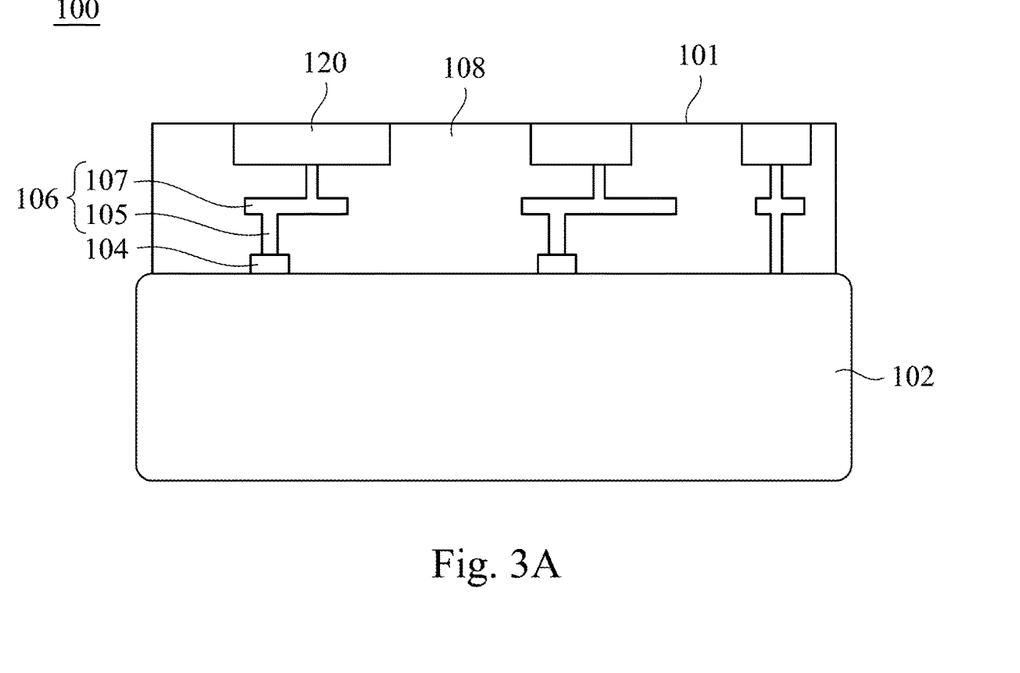
Figure 3B:
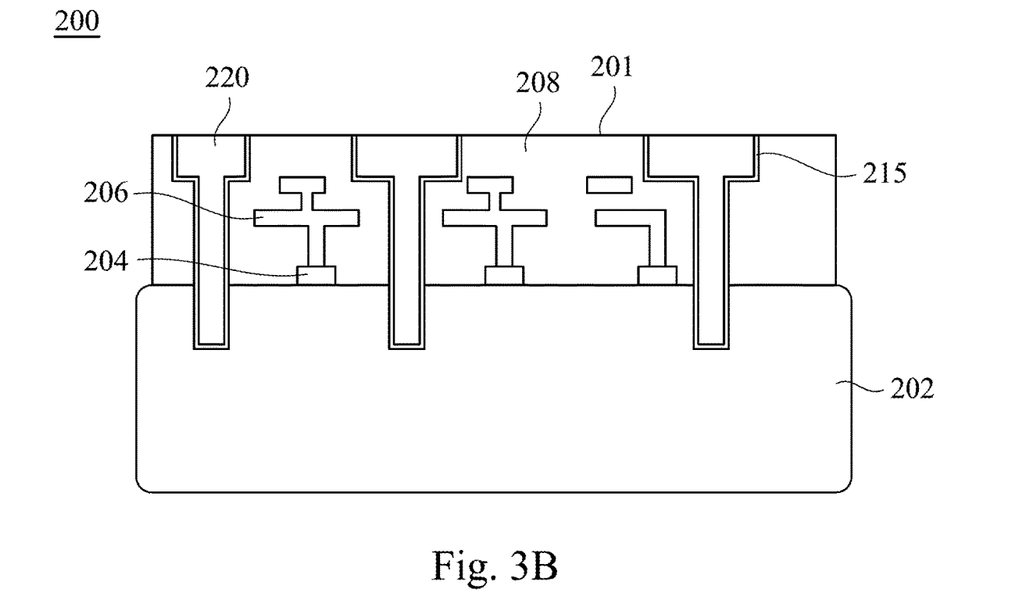

Referring to FIG. 3A, the first recesses 110 are filled with first polymers 120, respectively. More specifically, a polymer material is coated, such as by spin coating, over the first front-side surface 101 of the first wafer 100. During coating the polymer material, portions of the polymer material are filled in the first recesses 110, while an excess portion of the polymer material is over the front-side surface 101 of the first wafer 100 and is not in the first recesses 110. The first wafer 100 is then planarized at the first front-side surface 101 to remove the excess portion of the polymer material to form the first polymers 120 in the first recesses 110. The first wafer 100 may be planarized by any suitable method, such as chemical mechanical polishing (CMP). Each of the first polymers 120 serves as a sacrificial pad, which will be removed in subsequent process (see FIG. 7). The polymer material is flowable and is low thermal expansion materials. In some embodiments, the polymer material used to form the first polymers 120 are organic polymers, such as low density polyethylene (LDPE), high density polyethylene (HDPE), polypropylene (PP), polyvinyl chloride (PVC), polystyrene (PS), nylon, Teflon, thermoplastic polyurethane (TPU) or the like. The polymer material is contracted like other materials, such as metal, during the planarization; therefore after planarizing the polymer material to form the first polymers 120 in first recesses 110 in different sizes, the first front-side surface 101 is still flat (or smooth). The different sizes of the first polymers 120 at the first front-side surface 101 are planarized at substantially the same level due to the good flexibility of the polymer material, thereby reducing the dishing issue during planarizing. Referring to FIG. 3B, the second recesses 210 are filled with second polymers 220, respectively. The process of filling the second recesses 210 with the second polymers 220 and material of the second polymers 220 are similar to or the same as the process in FIG. 3A; therefore, detailed descriptions are not discussed herein.

Figure 4:
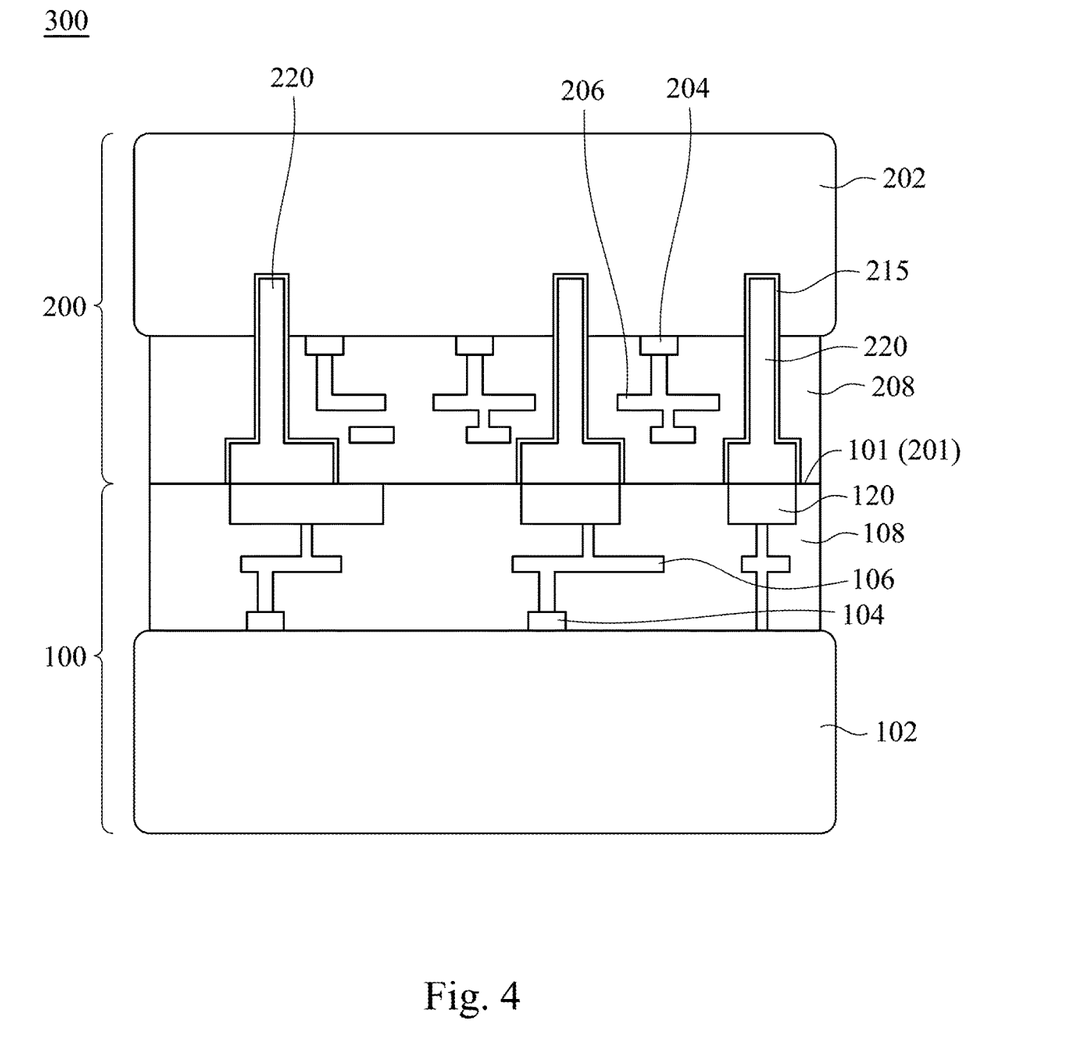

Referring to FIG. 4, a hybrid bonding process is performed. During the hybrid bonding process, the second wafer 200 is flipped upside down and disposed over the first wafer 100 to form a semiconductor device 300. The first front-side surface 101 of the first wafer 100 is bonded with the second front-side surface 201 of the second wafer 200 such that the first polymers 120 are bonded to the second polymers 220. Moreover, the first dielectric layer 108 of the first wafer 100 is also bonded to the second dielectric layer 208 of the second wafer 200. The first front-side surface 101 of the first wafer 100 and the second front-side surface 201 of the second wafer 200 are substantially planar and do not suffer from dishing issue. Therefore, the first wafer 100 and the second wafer 200 can bond with each other tightly, so that the first polymer 120 and the second polymer 220 are in contact with each other. The first polymers 120 in the first recesses 110 and the second polymers 220 in the second recesses 210 are formed in different sizes, so the size of each of the first polymers 120 is not necessarily the same as the size of the corresponding second polymers 220. That is, the sidewall of the first polymer 120 is not necessarily aligned with the sidewall of the corresponding second polymer 220. The term "corresponding second polymer 220" herein refers to the second polymer 220 in contact with the first polymer 110.

Figure 5:
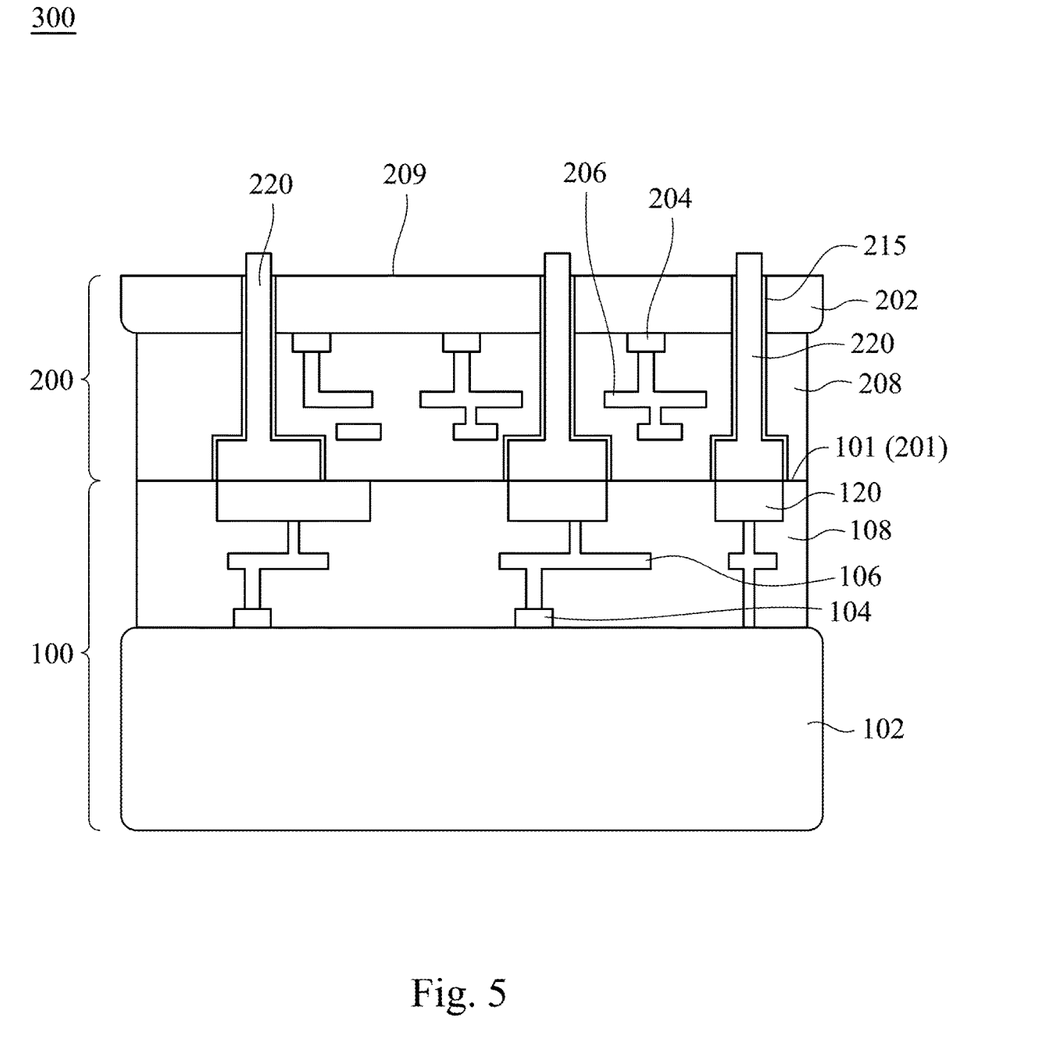

Referring to FIG. 5, the second wafer 200 is grinded from a backside surface 209 of the second wafer 200 to expose the second polymer 220 in the through substrate via holes 214 of the second recess 210 after bonding the first front-side surface 101 of the first wafer 100 with the second front-side surface 201 of the second wafer 200. The backside surface 209 is the surface of the substrate 202 and is opposite to the second front-side surface 201. The substrate 202 and the second polymers 220 in the through substrate via holes 214 are made of different materials. Only a portion of the substrate 202 may be removed in the process to thin the substrate 202, and portions of the second polymers 220 initially embedded in the substrate 202 are barely removed. Therefore, the second polymer 220 protrudes from the second recesses 210 and extends through the substrate 202. In some embodiments, a selective etching may be further performed after grinding the substrate 202 to partially remove the substrate 202. In some embodiments, the insulating layer 215 exposed from the second substrate 202 of the second wafer 200 is removed during the grinding process as shown in FIG. 5. In some other embodiments, the insulating layer 215 exposed from the second substrate 202 of the second wafer 200 may remain.

Figure 6:
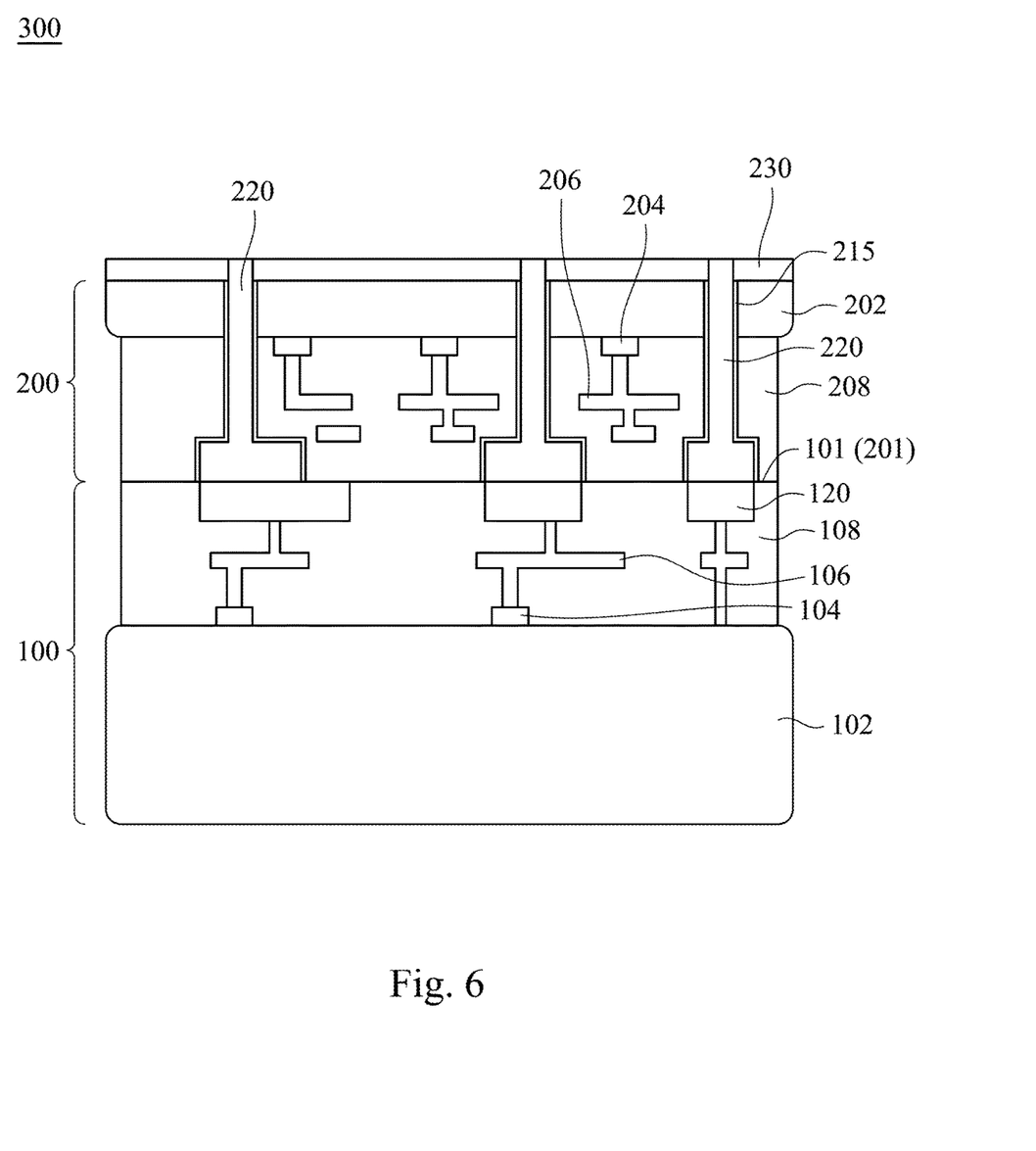

Referring to FIG. 6, a third dielectric layer 230 is formed over the backside surface 209 of the second wafer 200. In some embodiments, the third dielectric layer 230 is first formed to entirely cover the backside surface 209 of the second wafer 200 and the protruding second polymer 220. Subsequently, the third dielectric layer 230 is etched back to expose the second polymer 220. As such, the third dielectric layer 230 is formed between adjacent second polymers 220 to provide the electrical isolation between the subsequently formed contacts. Any suitable methods are available for forming the third dielectric layer 230. In some embodiments, the third dielectric layer 230 may be formed by CVD, PVD, ALD, or the like, and the third dielectric layer may be made of $SiO_2$, SiC, low-k materials, or the like.

Figure 7:
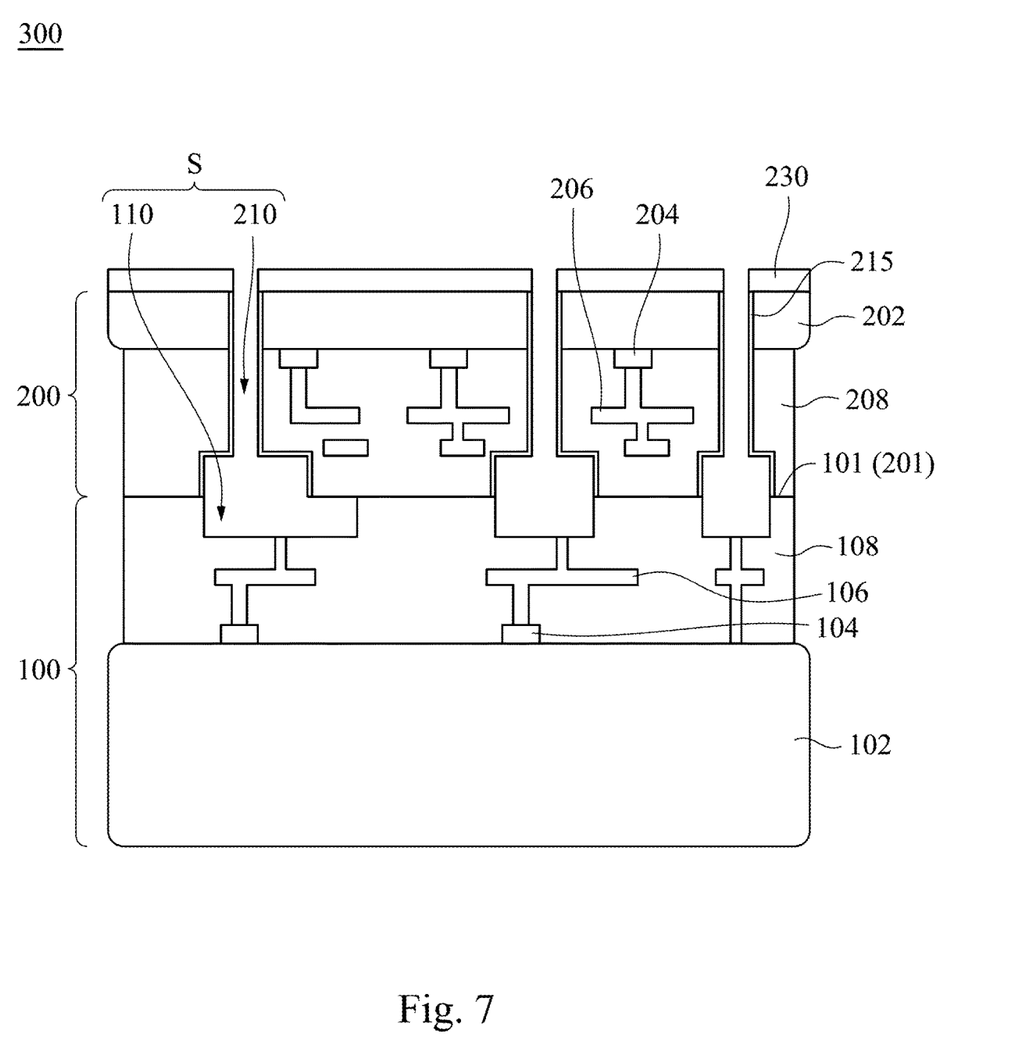

Referring to FIG. 7, the first polymer 120 in the first recesses 110 and the second polymer 220 in the second recesses 210 are removed. After removing the first polymer 120 and the second polymer 220, the first recess 110 and the second recess 210 together form a space S in the semiconductor device 300. The space S extends from the backside surface 209 of the second wafer 200 to the first wafer 100 to expose the first interconnect structures 106. The space S is between the adjacent second interconnect structures 206 and is not in contact with the second interconnect structures 206. The first polymers 120 and the second polymers 220 may be removed by any suitable method. In some embodiments, the first polymers 120 and the second polymers 220 are removed by using a selectively etching process including a chemical solvent that removes polymer materials (e.g., the first polymers 120 and the second polymers 220) with an etching rate faster than that removes dielectric materials (e.g., the first dielectric layer 108, the second dielectric layer 208, the insulating layer 215, and the third dielectric layer 230).

Figure 8:
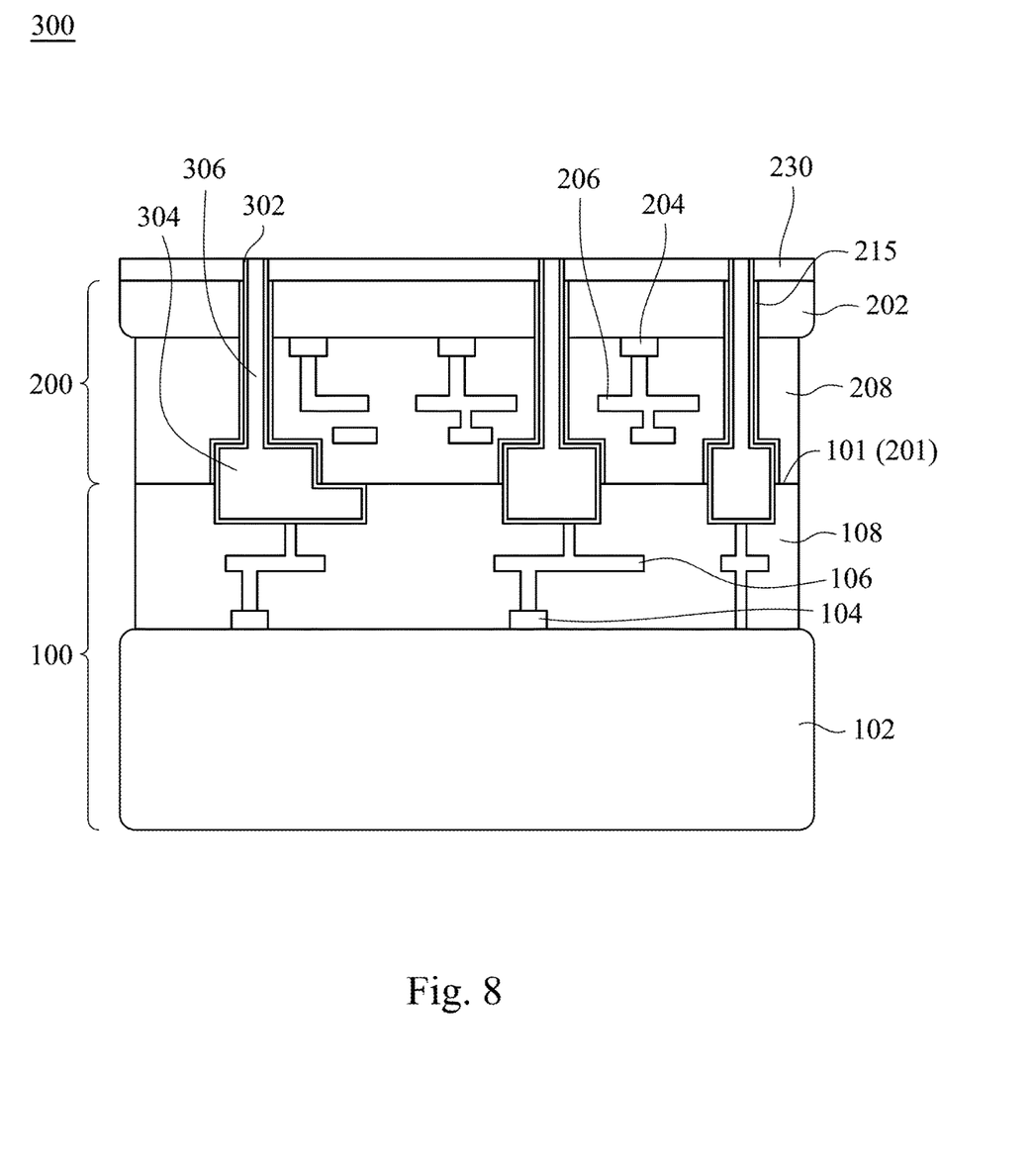

Referring to FIG. 8, barrier layers 302 are conformally formed in the first recesses 110 and the second recesses 210. Subsequently, metal materials are deposited in the first recesses 110 and the second recesses 210 to form conductive pads 304 and TSVs 306. The barrier layer 302 is used to prevent diffusion of the metal of the conductive pad 304 and the TSV 306 into the first dielectric layer 108 and the second dielectric layer 208 to damage the semiconductor device 300. The conductive pads 304 and the TSVs 306 can be formed in a single process. Therefore, each of the conductive pads 304 and the corresponding TSV 306 are a single piece of continuous material and are integrally formed. Similarly, each of the barrier layers 302 is conformally deposited in the first recess 110 and the corresponding second recess 210 in a single process. Therefore, the barrier layer 302 is a single piece of continuous material extending from a sidewall of the TSV 306, a sidewall of the conductive pad 304 to a bottom surface of the conductive pad 304. The barrier layers 302, the conductive pads 304 and the TSVs 306 may include suitable materials. In some embodiments, the barrier layers 302 may include tantalum, and the conductive pads 304 and the TSVs 306 may include copper.

Although FIG. 8 illustrates that the conductive pad 304 and the TSV 306 are a single piece of continuous material made in a single process, the conductive pad 304 and the TSV 306 may be made of different materials. For example, a conductive pad 304 may be first formed in the first recess 110 and the pad recess 212 of the second recess 210. The barrier layer 302 may be conformally formed over the conductive pad 304 and the sidewall of the through substrate via holes 214. The material of the TSV 306 may then be formed in the through substrate via holes 214.

Figure 9:
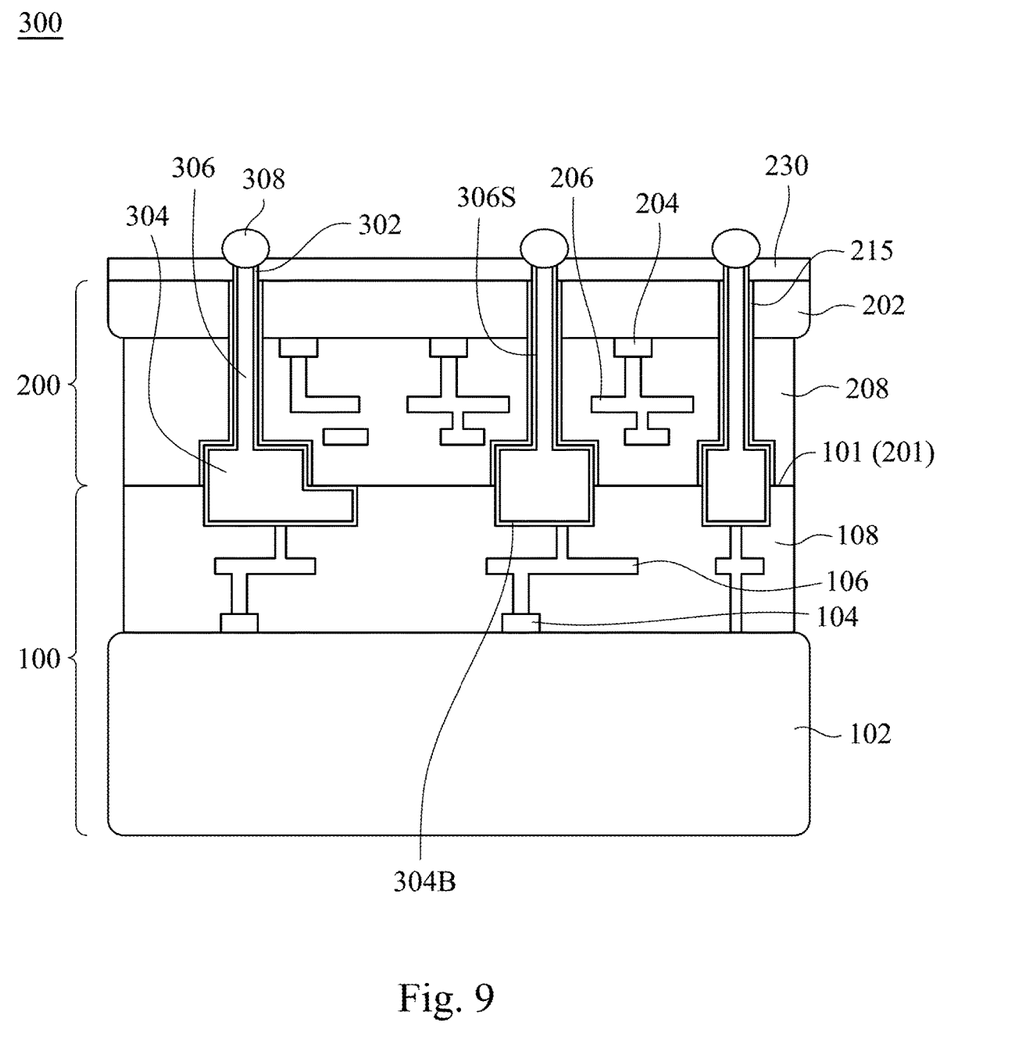

Referring to FIG. 9. bumps 308 are formed over the TSVs 306 after forming the conductive pad 304 and the TSV 306. The bumps 308 may be further connected to other application, such as a circuit board. The bumps 308 are made of conductive materials. In some embodiments, the bumps 308 are made of tin.

In FIG. 9, the semiconductor device 300 includes the first wafer 100, the second wafer 200, the through substrate via 306, the conductive pad 304, and the barrier layer 302. The first wafer 100 includes the first interconnect structure 108. The second wafer 200 includes the second interconnect structure 208 bonded to the first interconnect structure 108 of the first wafer 100. The through substrate via 306 extends through the second wafer 200. The conductive pad 304 is in contact with the through substrate via 306 and the first interconnect structure 108 of the first wafer 100. A portion of the conductive pad 304 is embedded in the second wafer 200. The barrier layer 302 extends from a sidewall 306S of the through substrate via 306 to a bottom surface 304B of the conductive pad 304.

Specifically, the barrier layer 302 laterally surrounds the through substrate via 306 and the conductive pad 304. Since the barrier layer 302 is formed after the hybrid bonding process, there is no interface (e.g., bonding interface) formed in the barrier layer 302 near the bonding surfaces of the first wafer 100 and the second wafer 200 (i.e., the first front-side surface 101 and the second front-side surface 201). Moreover, due to a portion of the first front-side surface 101 is exposed after the first polymers 120 and the second polymers 220 are removed (see FIGS. 6 and 7), the barrier layer 302 further covers and is in contact with the portion of the first front-side surface 101. Stated another way, because the sidewall of the first polymer 120 may be not aligned with the sidewall of the corresponding second polymer 220 (see FIG. 4), the barrier layer 302 may be formed horizontally at the first front-side surface 101 of the first wafer 100 (or the second front-side surface 201 of the second wafer 200).

As shown in FIG. 9, each of the conductive pads 304 has a first portion embedded in the first wafer 100 and a second portion embedded in the second wafer 200. Since the conductive pad 304 is formed after the hybrid bonding process, there is no interface (e.g., bonding interface) formed in the conductive pad 304 near the bonding surfaces of the first wafer 100 and the second wafer 200 (i.e., the first front-side surface 101 and the second front-side surface 201).

The semiconductor device further includes the third dielectric layer 230 covering the second wafer 200, such that the second wafer 200 is directly between the first wafer 100 and the third dielectric layer 230. The barrier layer 302 is in contact with the third dielectric layer 230 and the first interconnect structure 106 of the first wafer 100. Stated another way, the barrier layer 302 extends from the third dielectric layer 230 to the conductive vias 105 (see FIG. 1A) of the first interconnect structure 106.

The embodiments of the present disclosure can achieve some advantages. For example, the conductive pads are able to be formed in different sizes, so the conductive pad in one wafer is not necessarily aligned with the conductive pad in the other wafer during the hybrid bonding. The sacrificial pads made of polymer material have the good flexibility. When planarizing the surface of the wafer, the good flexibility of the polymer material makes the surface of the wafer more planar. Moreover, the polymer material is not that easy to thermally expand and contract during the planarization of the wafer. Although the sacrificial pads are made in different sizes, the surface of the wafer will not suffer from dishing issue. With such advantages, the issue arising from the planarization of the wafer to form the resulting semiconductor device may be reduced or eliminated.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of manufacturing a semiconductor device, comprising:
    forming a first recess in a first wafer, wherein the first recess is at a first front-side surface of the first wafer and exposes a first interconnect structure in the first wafer;
    forming a second recess in a second wafer, wherein the second recess is at a second front-side surface of the second wafer;
    filling the first recess with a first polymer;
    filling the second recess with a second polymer;
    bonding the first front-side surface of the first wafer with the second front-side surface of the second wafer such that the first polymer is bonded to the second polymer;
    removing the first polymer in the first recess and the second polymer in the second recess; and
    depositing a metal in the first recess and the second recess.

2. The method of claim 1, wherein the first recess is different in size from the second recess.

3. The method of claim 1, wherein the filling the first recess with the first polymer comprises:
    coating a polymer material over the first front-side surface of the first wafer; and
    planarizing the first wafer at the first front-side surface to remove an excess portion of the polymer material to form the first polymer in the first recess.

4. The method of claim 1, wherein a first dielectric layer of the first wafer is bonded to a second dielectric layer of the second wafer during bonding the first front-side surface of the first wafer with the second front-side surface of the second wafer such that the first polymer is bonded to the second polymer.

5. The method of claim 4, wherein depositing the metal in the first recess and the second recess is such that the metal deposited in the first recess and the second recess is integrally formed.

6. The method of claim 1, further comprising conformally depositing an insulating layer in the second recess before filling the second recess with the second polymer.

7. The method of claim 1, wherein forming the second recess in the second wafer comprises:
    forming a pad recess of the second recess at the second front-side surface of the second wafer; and
    forming a through substrate via hole of the second recess in the pad recess and extending to a substrate of the second wafer.

8. The method of claim 7, further comprising:
    grinding the second wafer from a backside surface of the second wafer to expose the second polymer in the through substrate via hole of the second recess after bonding the first front-side surface of the first wafer with the second front-side surface of the second wafer; and
    forming a third dielectric layer over the backside surface of the second wafer before removing the first polymer in the first recess and the second polymer in the second recess.

9. The method of claim 7, further comprising forming a bump over the metal in the through substrate via hole after depositing the metal in the first recess and the second recess.

10. The method of claim 1, further comprising depositing a barrier layer in the first recess and the second recess after removing the first polymer in the first recess and the second polymer in the second recess.

11. The method of claim 1, wherein the first polymer in the first recess is removed by using a chemical solvent.

12. The method of claim 1, wherein the metal comprises copper.

13. The method of claim 1, wherein a width of the first recess is in a range from 0.2 μm to 20 μm.

14. A semiconductor device, comprising:
a first wafer comprising a first interconnect structure;
a second wafer comprising a second interconnect structure bonded to the first interconnect structure of the first wafer;
a through substrate via extending through the second wafer;
a conductive pad in contact with the through substrate via and the first interconnect structure of the first wafer, wherein a portion of the conductive pad is embedded in the second wafer; and
a barrier layer extending from a sidewall of the through substrate via to a bottom surface of the conductive pad.

15. The semiconductor device of claim 14, wherein the barrier layer is a single piece of continuous material.

16. The semiconductor device of claim 14, wherein the barrier layer is in contact with a front-side surface of the first wafer.

17. The semiconductor device of claim 14, wherein the conductive pad and the through substrate via are a single piece of continuous material.

18. The semiconductor device of claim 14, further comprising a dielectric layer covering the second wafer, such that the second wafer is directly between the first wafer and the dielectric layer.

19. The semiconductor device of claim 18, wherein the barrier layer is in contact with the dielectric layer and the first interconnect structure of the first wafer.

* * * * *